US012658928B2

(12) United States Patent
Dai et al.

(10) Patent No.: US 12,658,928 B2
(45) Date of Patent: Jun. 16, 2026

(54) INTEGRATED CIRCUIT WITH MULTIPLE CLOCK SIGNALS AND OPERATION METHOD THEREOF

(71) Applicant: Realtek Semiconductor Corporation, Hsinchu (TW)

(72) Inventors: Hong-Hai Dai, Jiangsu Province (CN); QingZhe Qiu, Jiangsu Province (CN); Haitao Li, Jiangsu Province (CN)

(73) Assignee: Realtek Semiconductor Corporation, Hsinchu (TW)

( * ) Notice: Subject to any disclaimer, the term of this patent is extended or adjusted under 35 U.S.C. 154(b) by 0 days.

(21) Appl. No.: 18/957,883

(22) Filed: Nov. 25, 2024

(65) Prior Publication Data

US 2025/0175184 A1     May 29, 2025

(30) Foreign Application Priority Data

Nov. 28, 2023     (CN) .......................... 202311617498.1

(51) Int. Cl.
  *H03L 7/099*     (2006.01)
  *H03K 21/08*     (2006.01)
(52) U.S. Cl.
  CPC ............. *H03L 7/099* (2013.01); *H03K 21/08* (2013.01)
(58) Field of Classification Search
  CPC ....................................................... H03L 7/099
  USPC ......................................................... 331/1 R
  See application file for complete search history.

(56) References Cited

U.S. PATENT DOCUMENTS

| | | | | |
|---|---|---|---|---|
| 4,670,888 | A | * | 6/1987 | Smith, III ............ H03C 3/0966 |
| | | | | 331/1 R |
| 5,410,571 | A | * | 4/1995 | Yonekawa ............ H03L 7/0898 |
| | | | | 331/DIG. 2 |
| 11,175,691 | B1 | * | 11/2021 | Tyminski ................ G06F 1/324 |
| 2011/0074514 | A1 | * | 3/2011 | Marutani ................ H03L 7/183 |
| | | | | 324/76.39 |
| 2014/0184289 | A1 | | 7/2014 | Gailus et al. |
| 2020/0112315 | A1 | * | 4/2020 | Zhang ..................... H03L 7/087 |
| 2024/0223193 | A1 | * | 7/2024 | Wu .......................... H03L 7/081 |

FOREIGN PATENT DOCUMENTS

| | | | | |
|---|---|---|---|---|
| CN | 101944912 | A | 1/2011 | |
| CN | 110166047 | B | * 11/2020 | ............. H03L 7/095 |

* cited by examiner

*Primary Examiner* — Joseph Chang
(74) *Attorney, Agent, or Firm* — CKC & Partners Co., LLC

(57) ABSTRACT

An integrated circuit with multiple clock signals includes a crystal oscillator circuit, a first function circuit, a phase-locked loop circuit, and a second function circuit. The crystal oscillator circuit is configured to generate a first clock signal. The first function circuit is configured to receive the first clock signal and operates according to the first clock signal. The phase-locked loop circuit is configured to generate a second clock signal according to the first clock signal. The second function circuit is configured to receive the second clock signal and operates according to the second clock signal.

16 Claims, 9 Drawing Sheets

200 crystal oscillator circuit — 210 reference clock signal generator circuit — 250

CLK1

CLK_REF counter circuit — 260

CNT phase-locked loop circuit — 230

CLK_REF function circuit — 220

CLK1

CLK2 function circuit — 240

100

200

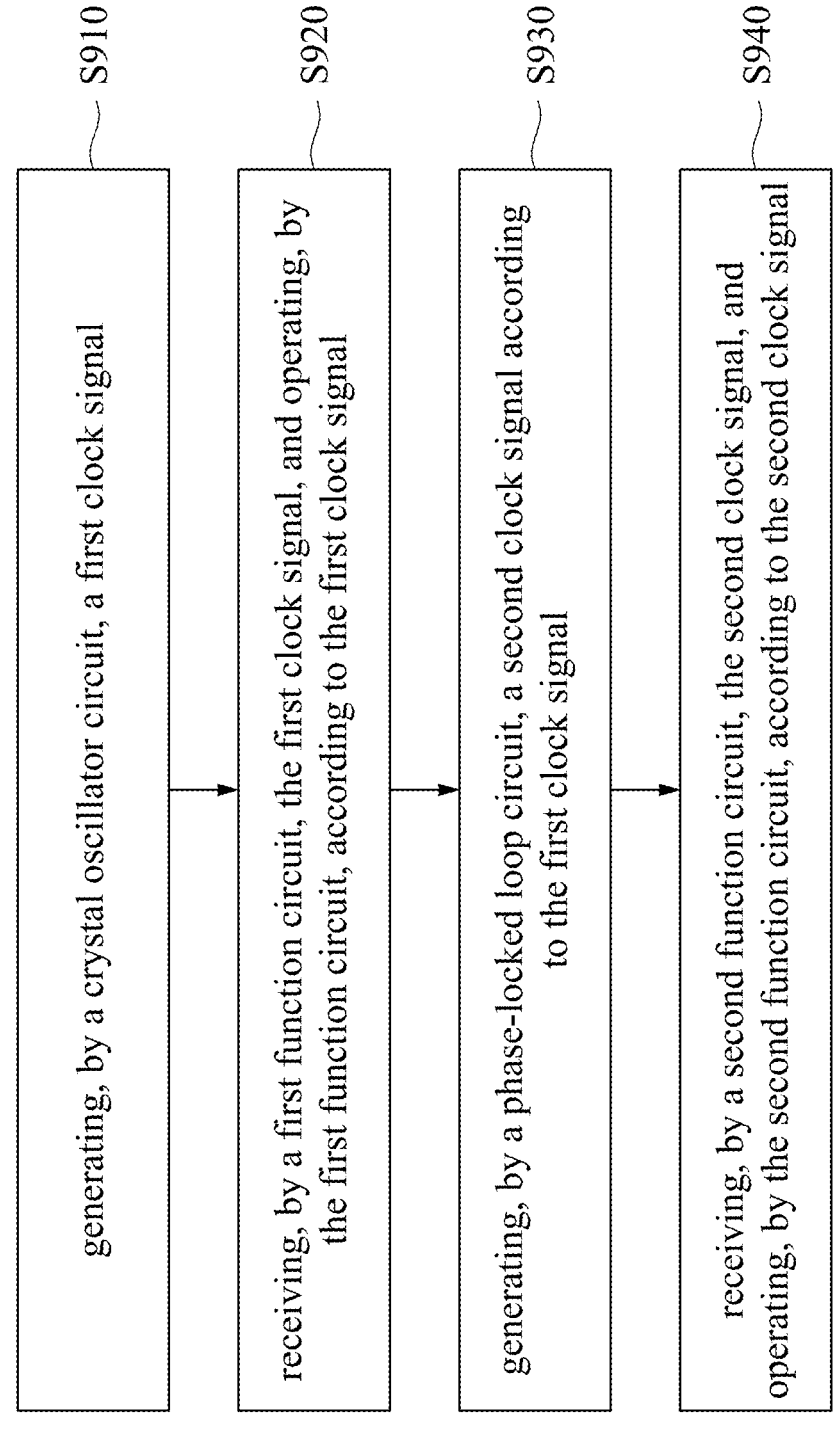

900

S910 generating, by a crystal oscillator circuit, a first clock signal

S920 receiving, by a first function circuit, the first clock signal, and operating, by the first function circuit, according to the first clock signal

S930 generating, by a phase-locked loop circuit, a second clock signal according to the first clock signal

S940 receiving, by a second function circuit, the second clock signal, and operating, by the second function circuit, according to the second clock signal

FIG. 9

INTEGRATED CIRCUIT WITH MULTIPLE CLOCK SIGNALS AND OPERATION METHOD THEREOF

RELATED APPLICATIONS

This application claims priority to Chinese Application Serial Number 202311617498.1, filed Nov. 28, 2023, which is herein incorporated by reference.

BACKGROUND

Technical Field

The present disclosure relates to technology about clock signals. More particularly, the present disclosure relates to an integrated circuit with multiple clock signal and operation method thereof.

Description of Related Art

With development of technology, various integrated circuits are developed. In some prior arts, when there are two circuits on a system on a chip (SoC) and the two circuits operate based on two different clock signals respectively, it needs to dispose two crystal oscillator circuits on the SoC to generate the two different clock signals. However, this method will increase cost and occupy a larger space on the printed circuit board.

SUMMARY

Some aspects of the present disclosure are to provide an integrated circuit with multiple clock signals. The integrated circuit with the multiple clock signals includes a crystal oscillator circuit, a first function circuit, a phase-locked loop circuit, and a second function circuit. The crystal oscillator circuit is configured to generate a first clock signal. The first function circuit is configured to receive the first clock signal and operate according to the first clock signal. The phase-locked loop circuit is configured to generate a second clock signal according to the first clock signal. The second function circuit is configured to receive the second clock signal and operate according to the second clock signal.

Some aspects of the present disclosure are to provide an operation method of an integrated circuit with multiple clock signals. The operation method includes: generating, by a crystal oscillator circuit, a first clock signal; receiving, by a first function circuit, the first clock signal, and operating, by the first function circuit, according to the first clock signal; generating, by a phase-locked loop circuit, a second clock signal according to the first clock signal; and receiving, by a second function circuit, the second clock signal, and operating, by the second function circuit, according to the second clock signal.

BRIEF DESCRIPTION OF THE DRAWINGS

The disclosure can be more fully understood by reading the following detailed description of the embodiment, with reference made to the accompanying drawings as follows:

FIG. 9 is a flow diagram of an operation method according to some embodiments of the present disclosure.

DETAILED DESCRIPTION

In the present disclosure, "connected" or "coupled" may refer to "electrically connected" or "electrically coupled." "Connected" or "coupled" may also refer to operations or actions between two or more elements.

Figure 1:
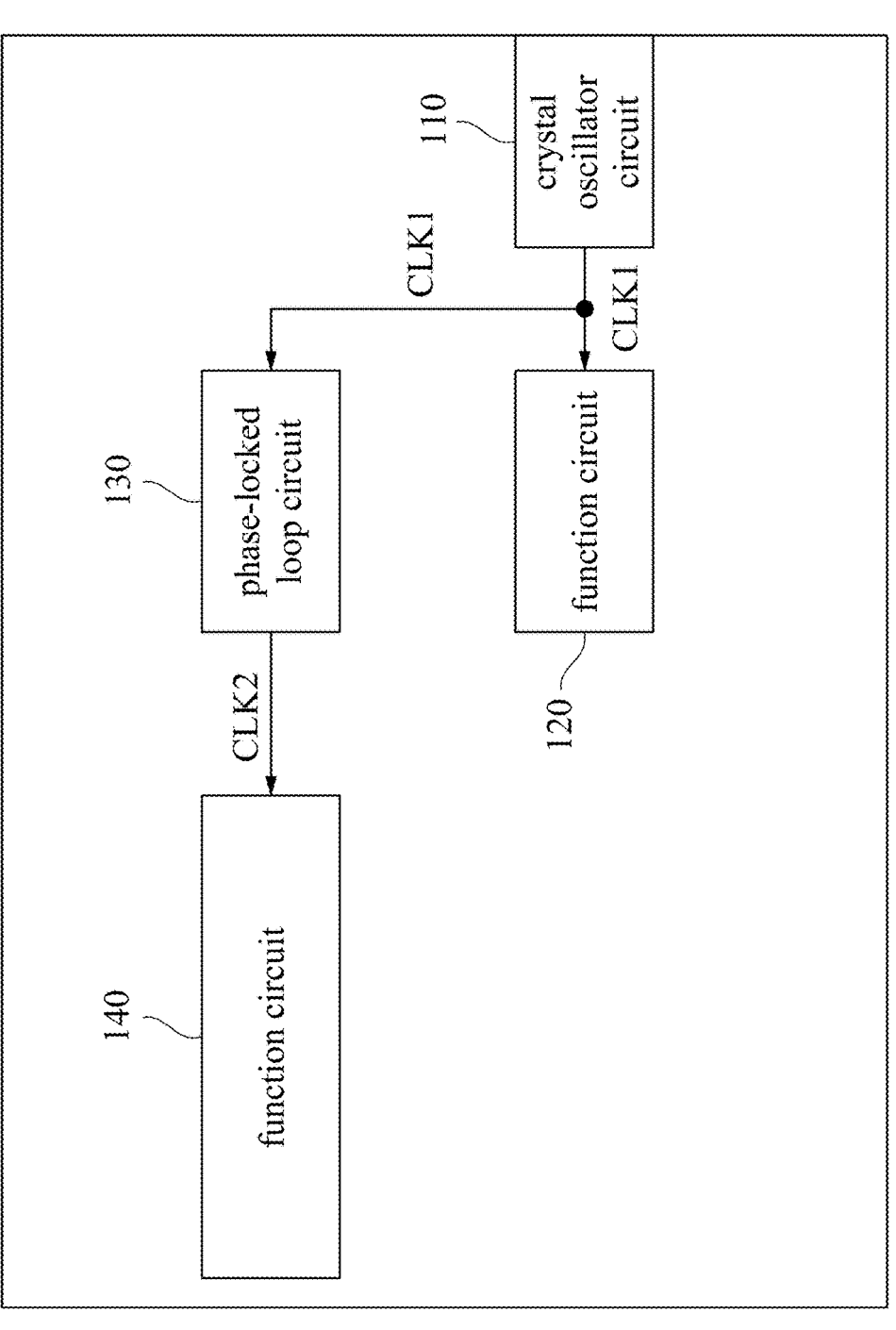
FIG. 1 is a schematic diagram of an integrated circuit with multiple clock signals according to some embodiments of the present disclosure.

Reference is made to FIG. 1. FIG. 1 is a schematic diagram of an integrated circuit 100 with multiple clock signals according to some embodiments of the present disclosure. The integrated circuit 100 can operate based on two clock signals CLK1 and CLK2. In some embodiments, the integrated circuit 100 can be implemented by a system on a chip (SoC).

As illustrated in FIG. 1, the integrated circuit 100 includes a crystal oscillator circuit 110, a function circuit 120, a phase-locked loop circuit 130, and a function circuit 140. Regarding coupling relationships, the crystal oscillator circuit 110 is coupled to the function circuit 120 and the phase-locked loop circuit 130. The phase-locked loop circuit 130 is coupled to the function circuit 140.

The crystal oscillator circuit 110 can generate a clock signal CLK1 and transmit the clock signal CLK1 to the function circuit 120 and the phase-locked loop circuit 130. In some embodiments, the crystal oscillator circuit 110 includes a quartz crystal and two capacitors.

The function circuit 120 can receive the clock signal CLK1 and operate according to the clock signal CLK1. In some embodiments, the function circuit 120 includes a real time clock (RTC) circuit, but the present disclosure is not limited thereto. The real time clock circuit can provide precise actual time.

The phase-locked loop circuit 130 can generate the clock signal CLK2 according to the clock signal CLK1, and transmit the clock signal CLK2 to the function circuit 140. In general, a frequency of the clock signal CLK2 is different from a frequency of the clock signal CLK1. For example, the frequency of the clock signal CLK1 can be 32.768 KHz and the frequency of the clock signal CLK2 can be 900 MHZ, but the present disclosure is not limited thereto.

The function circuit 140 can receive the clock signal CLK2 and operate according to the clock signal CLK2. In some embodiments, the function circuit 140 includes a central processor circuit, a universal serial bus circuit, or an Ethernet circuit, but the present disclosure is not limited thereto.

In some prior arts, when there are two circuits are on a system on a chip (SoC) and the two circuits operate based on two different clock signals respectively, it needs to dispose two crystal oscillator circuits on the SoC to generate the two different clock signals. That is, there are two quartz crystals and four capacitors on the SoC in the prior arts. However, this method will increase cost and occupy a larger space on the printed circuit board.

Compared to the prior arts, in the present disclosure, only the single crystal oscillator circuit 110 is required to make the function circuit 120 and the function circuit 140 operate according to the different clock signals CLK1 and the clock signal CLK2. Accordingly, the present disclosure not only reduces cost but also occupies a smaller space on the printed circuit board to improve the space utilization of the printed circuit board.

Figure 2:
FIG. 2 is a schematic diagram of an integrated circuit with multiple clock signals according to some embodiments of the present disclosure.
Figure 2:

Reference is made to FIG. 2. FIG. 2 is a schematic diagram of an integrated circuit 200 with multiple clock signals according to some embodiments of the present disclosure. In some embodiments, the integrated circuit 200 can be used to implement the integrated circuit 100 in FIG. 1.

As illustrated in FIG. 2, in addition to a crystal oscillator circuit 210, a function circuit 220, a phase-locked loop circuit 230, and a function circuit 240, the integrated circuit 200 further includes a reference clock signal generator circuit 250 and a counter circuit 260.

Regarding coupling relationships, the crystal oscillator circuit 210 is coupled to the function circuit 220 and the counter circuit 260. The phase-locked loop circuit 230 is coupled to the function circuit 240, the reference clock signal generator circuit 250, and the counter circuit 260. The reference clock signal generator circuit 250 is coupled to the counter circuit 260.

Implementations and operations of the crystal oscillator circuit 210 and the function circuit 220 are similar to the implementations and the operations of the crystal oscillator circuit 110 and the function circuit 120 in FIG. 1 respectively. The crystal oscillator circuit 210 can further transmit the clock signal CLK1 to the counter circuit 260. In general, the clock signal CLK1 is stable.

The reference clock signal generator circuit 250 can generate a reference clock signal CLK_REF and transmit the reference clock signal CLK_REF to the counter circuit 260 and the phase-locked loop circuit 230. In some embodiments, the reference clock signal generator circuit 250 includes resistors, capacitors, or inductors. These elements can form an oscillator circuit. The oscillator circuit can generate the reference clock signal CLK_REF. However, due to manufacture factors or other factors, the reference clock signal CLK_REF is generally unstable.

The counter circuit 260 can receive the stable clock signal CLK1 and the unstable reference clock signal CLK_REF, and generate a counting value CNT according to the clock signal CLK1 and the reference clock signal CLK_REF. Then, the counter circuit 260 can transmit the counting value CNT to the phase-locked loop circuit 230. Details of how the counter circuit 260 generates the counting value CNT will be described in following paragraphs with reference to FIG. 3 and FIG. 4.

The phase-locked loop circuit 230 can receive the reference clock signal CLK_REF and the counting value CNT, and generate the clock signal CLK2 according to the reference clock signal CLK_REF and the counting value CNT. Then, the phase-locked loop circuit 230 can transmit the clock signal CLK2 to the function circuit 240.

Implementations and operations of the phase-locked loop circuit 230 and the function circuit 240 are similar to the implementations and the operations of the phase-locked loop circuit 130 and the function circuit 140 in FIG. 1 respectively. In this architecture, the function circuit 220 and the function circuit 240 can operate according to the different clock signals CLK1 and CLK2 respectively.

Details of how the counter circuit 260 generates the counting value CNT will be described in following paragraphs with reference to FIG. 3 and FIG. 4.

Figure 3:
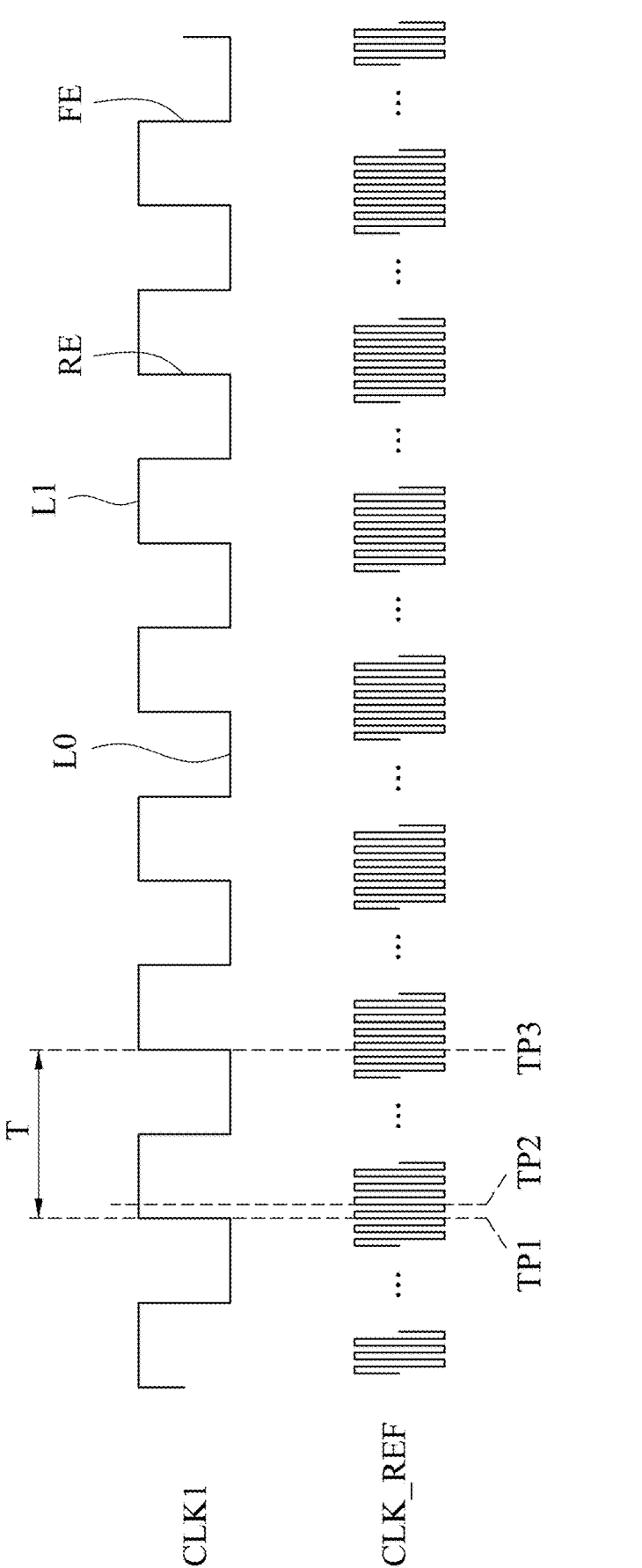
FIG. 3 is a waveform diagram of a clock signal and a reference clock signal according to some embodiments of the present disclosure.

Reference is made to FIG. 3. FIG. 3 is a waveform diagram of the clock signal CLK1 and the reference clock signal CLK_REF according to some embodiments of the present disclosure.

As described above, the clock signal CLK1 is generally stable but the reference clock signal CLK_REF is generally unstable. That is to say, the clock signal CLK1 has a stable period T. For example, the frequency of the clock signal CLK1 can be 32.768 KHz and the period T can be 1/3276.8 ms, and the frequency of the reference clock signal CLK_REF can be 3.2768 MHz, but the present disclosure is not limited thereto. In other words, the frequency of the unstable reference clock signal CLK_REF is higher than the frequency of the stable clock signal CLK1. The counter circuit 260 in FIG. 2 can count a quantity of a rising edge RE of the reference clock signal CLK_REF in the period T, a quantity of a falling edge FE of the reference clock signal in the period T, an occurrence quantity of a high logic level L1 (e.g., a logic level 1) of the reference clock signal CLK_REF in the period T, or an occurrence quantity of a low logic level L0 (e.g., a logic level 0) of the reference clock signal CLK_REF in the period T to generate the counting value CNT.

Figure 4:
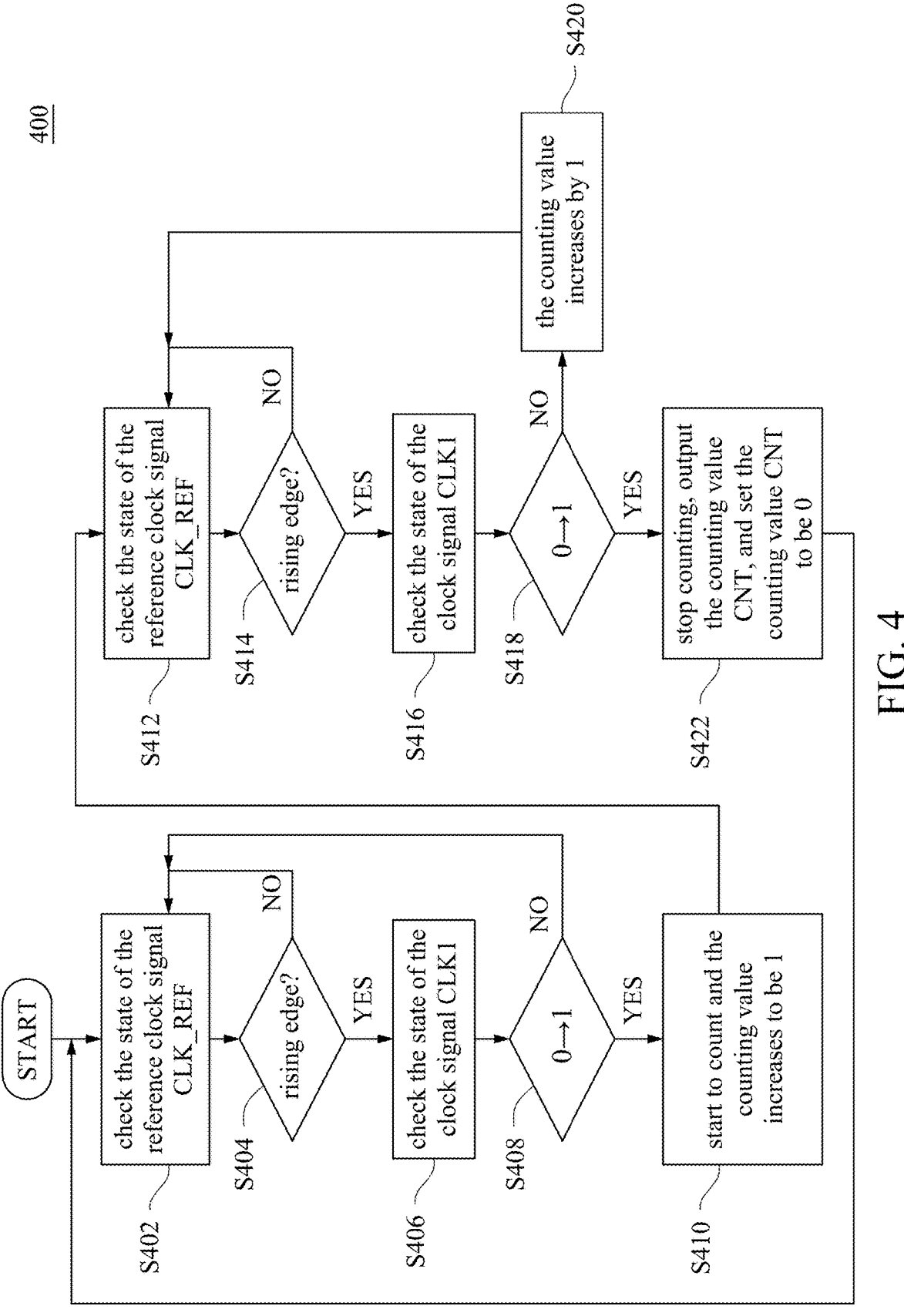
FIG. 4 is a flow diagram of a generation method of generating a counting value according to some embodiments of the present disclosure.

Reference is made to FIG. 4. FIG. 4 is a flow diagram of a generation method 400 of generating the counting value CNT according to some embodiments of the present disclosure.

It is noted that the generation method 400 is described with an example of how the counter circuit 260 in FIG. 2 counts the quantity of the rising edge RE of the reference clock signal CLK_REF in the period T to generate the counting value CNT. How the counter circuit 260 counts the quantity of the falling edge FE of the reference clock signal CLK_REF in the period T, the occurrence quantity of the high logic level L1 in the period T, or the occurrence quantity of the low logic level L0 in the period T to generate the counting value CNT has similar principles, so they are not described herein again.

As illustration in FIG. 4, the generation method 400 includes operation S402, operation S404, operation S406, operation S408, operation S410, operation S412, operation S414, operation S416, operation S418, operation S420, and operation S422.

In operation S402, the counter circuit 260 checks the state of the reference clock signal CLK_REF. At this time, the counting value CNT can be set as an initial value (e.g., 0). Then, the generation method 400 enters operation S404.

In operation S404, the counter circuit 260 determines whether the state of the reference clock signal CLK_REF is the rising edge RE.

As illustrated in FIG. 3, at a timing point TP1, the state of the reference clock signal CLK_REF is the rising edge RE, the determination of operation S404 is "YES" and the generation method 400 enters operation S406. When the determination of operation S404 is "NO", the generation method 400 returns to operation S402 such that the counter circuit 260 continues to check the state of the reference clock signal CLK_REF.

In operation S406, the counter circuit 260 checks the state of the clock signal CLK1. Then, the generation method 400 enters operation S408.

In operation S408, the counter circuit 260 determines whether the state of the clock signal CLK1 changes from the low logic level L0 to the high logic level L1.

As illustrated in FIG. 3, at the timing point TP1, the state of the clock signal CLK1 changes from the low logic level L0 to the high logic level L1, so the determination of operation S408 is "YES" and the generation method 400 enters operation S410. The determination of "YES" in operation S408 at the timing point TP1 indicates that the timing point TP1 is a starting point of the period T of the clock signal CLK1. If the determination of operation S408 is "NO", the generation method 400 returns to operation S402 such that the counter circuit 260 continues to check the state of the reference clock signal CLK_REF.

In operation S410, the counter circuit 260 starts to count and the counting value CNT increases to 1. Then, the generation method 400 enters operation S412.

In operation S412, the counter circuit 260 checks the state of the reference clock signal CLK_REF. Then, the generation method 400 enters operation S414.

In operation S414, the counter circuit 260 determines whether the state of the reference clock signal CLK_REF is the rising edge RE.

As illustrated in FIG. 3, at a timing point TP2, the state of the reference clock signal CLK_REF is the rising edge RE, so the determination of operation S414 is "YES" and the generation method 400 enters operation S416. When the determination of operation S414 is "NO", the generation method 400 returns to operation S412 such that the counter circuit 260 continues to check the state of the reference clock signal CLK_REF.

In operation S416, the counter circuit 260 checks the state of the clock signal CLK1. Then, the generation method 400 enters operation S418.

In operation S418, the counter circuit 260 determines whether the state of the clock signal CLK1 changes from the low logic level L0 to the high logic level L1.

As illustrated in FIG. 3, at the timing point TP2, the state of the clock signal CLK1 is not from the low logic level L0 to the high logic level L1, so the determination of operation S418 is "NO" and the generation method 400 enters operation S420.

In operation S420, the counter circuit 260 increases the counting value CNT by 1. That is to say, the counting value CNT at this time is 2 and the counting value CNT at this time indicates that the reference clock signal CLK_REF has two rising edges RE from the timing point TP1 to the timing point TP2. Then, the generation method 400 returns to operation S412 such that the counter circuit 260 continues to check the state of the reference clock signal CLK_REF.

When the generation method 400 enters operation S418 again at a timing point TP3, the counter circuit 260 determines whether the state of the clock signal CLK1 changes from the low logic level L0 to the high logic level L1.

As illustrated in FIG. 3, at the timing point TP3, the state of the clock signal CLK1 changes from the low logic level L0 to the high logic level L1, so the determination of operation S418 is "YES" and the generation method 400 enters operation S422. The determination of "YES" in operation S418 at the timing point TP3 indicates that the timing point TP3 is an ending point of the period T of the clock signal CLK1. The counting value CNT at this time indicates that the quantity of the rising edge RE of the reference clock signal CLK_REF from the timing point TP1 to the timing point TP3 (i.e., in the period T of the clock signal CLK1). Then, the generation method 400 enters operation S422.

In operation S422, the counter circuit 260 stops counting and outputs the counting value CNT. On the other hand, the counter circuit 260 sets the counting value CNT to the initial value (e.g., 0) to restart counting.

Reference is made to FIG. 2 again. When the counting value CNT is different from a threshold value, the phase-locked loop circuit 230 is controlled to adjust the frequency of the clock signal CLK2. Taking the frequency of the clock signal CLK1 as 32.768 kHz and the frequency of the reference clock signal CLK_REF as 3.2768 MHz as an example, the threshold value can be set to 100. To be more specific, when the counting value CNT is greater than the threshold value, it indicates that the frequency of the reference clock signal CLK_REF inputted into the phase-locked loop circuit 230 is high. Accordingly, the phase-locked loop circuit 230 is controlled to reduce the frequency of the clock signal CLK2. On the contrary, when the counting value CNT is less than the threshold value, it indicates that the frequency of the reference clock signal CLK_REF inputted into the phase-locked loop circuit 230 is low. Accordingly, the phase-locked loop circuit 230 is controlled to increase the frequency of the clock signal CLK2. Details of how the phase-locked loop circuit 230 is controlled will be described in following paragraphs with reference to FIG. 7.

As described above, due to the manufacture factors or other factors, the reference clock signal CLK_REF is generally unstable. However, when the reference clock signal CLK_REF is unstable, the clock signal CLK2 generated by the phase-locked loop circuit 230 according to the unstable reference clock signal CLK_REF is also unstable. However, by the operations above (using the stable clock signal CLK1 to generate the counting value CNT to adjust the frequency of the clock signal CLK2), the frequency of the clock signal CLK2 can be (almost) equal to a target frequency to generate the stable clock signal CLK2. Accordingly, not only the function circuit 220 can operate according to the stable clock signal CLK1, but also the function circuit 240 can also operate according to the stable clock signal CLK2.

In some embodiments, it is assumed that a target frequency of the clock signal CLK2 is 900 MHz and the reference clock signal CLK_REF is 900.1 MHz or 899.9 MHZ. By the operations above, the portion (elements or circuits) corresponding to fraction in the phase-locked loop circuit 230 can be adjusted such that the frequency of the clock signal CLK2 is closer to its target frequency.

Figure 5:
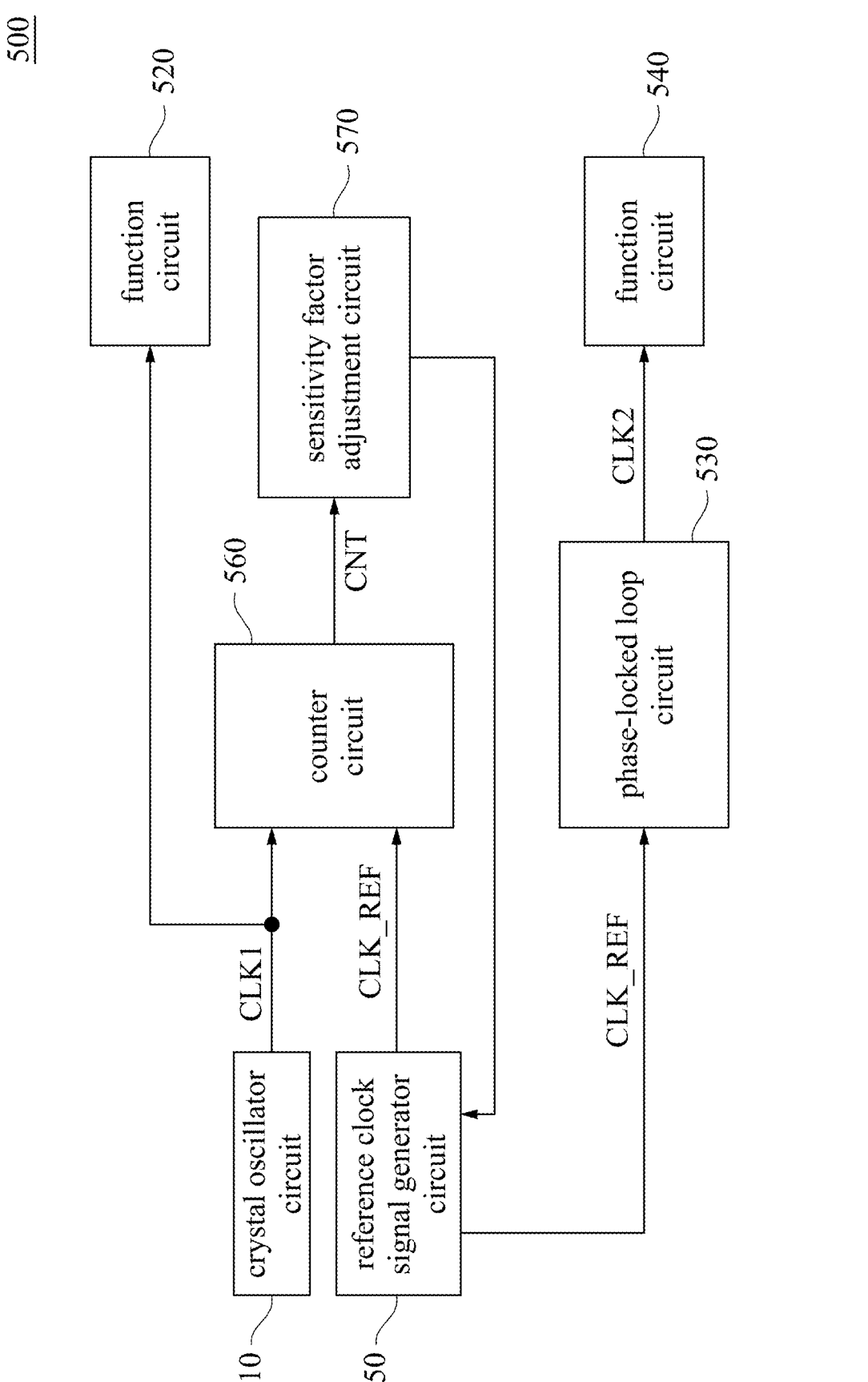
FIG. 5 is a schematic diagram of an integrated circuit with multiple clock signals according to some embodiments of the present disclosure.

As illustrated in FIG. 5. FIG. 5 is a schematic diagram of an integrated circuit 500 with multiple clock signals according to some embodiments of the present disclosure.

As illustrated in FIG. 5, the integrated circuit 500 includes a crystal oscillator circuit 510, a function circuit 520, a phase-locked loop circuit 530, a function circuit 540, a reference clock signal generator circuit 550, a counter circuit 560, and a sensitivity factor adjustment circuit 570.

Similar to the integrated circuit 200 in FIG. 2, the reference clock signal generator circuit 550 can generate the reference clock signal CLK_REF and transmit the reference clock signal CLK_REF to the counter circuit 560. The counter circuit 560 can receive the clock signal CLK1 and the reference clock signal CLK_REF, and generate the counting value CNT according to the clock signal CLK1 and the reference clock signal CLK_REF.

One of main differences between the integrated circuit 500 and the integrated circuit 200 in FIG. 2 is that the counter circuit 560 transmits the counting value CNT generated by it to the sensitivity factor adjustment circuit 570. The sensitivity factor adjustment circuit 570 can receive the counting value CNT, and control the reference clock signal generator circuit 550 according to the counting value CNT to adjust the reference clock signal CLK_REF.

When the counting value CNT is different from the threshold value, the sensitivity factor adjustment circuit 570 controls the reference clock signal generator circuit 550 to adjust the frequency of the unstable reference clock signal CLK_REF to generate the stable reference clock signal CLK_REF. Then, the reference clock signal generator circuit 550 can transmit the stable reference clock signal CLK_REF to the phase-locked loop circuit 530. To be more specific, when the counting value CNT is greater than the threshold value, in indicates that the frequency of the reference clock signal CLK_REF is high. Accordingly, the sensitivity factor adjustment circuit 570 controls the reference clock signal generator circuit 550 to reduce the frequency of the reference clock signal CLK_REF. On the contrary, when the counting value CNT is less than the threshold value, it indicates that the frequency of the reference clock signal CLK_REF is low. Accordingly, the sensitivity factor adjustment circuit 570 controls the reference clock signal generator circuit 550 to increase the frequency of the reference clock signal CLK_REF. Then, the phase-locked loop circuit 530 can receive the adjusted (stable) reference clock signal CLK_REF, generate the stable clock signal CLK2 according to the adjusted (stable) reference clock signal CLK_REF, and transmit the stable clock signal CLK2 to the function circuit 540. Accordingly, not only the function circuit 520 can operate according to the stable clock signal CLK1, but also the function circuit 540 can also operate according to the stable clock signal CLK2. Details of how the sensitivity factor adjustment circuit 570 controls the reference clock signal generator circuit 550 will be described in following paragraphs with reference to FIG. 8.

Figure 6:
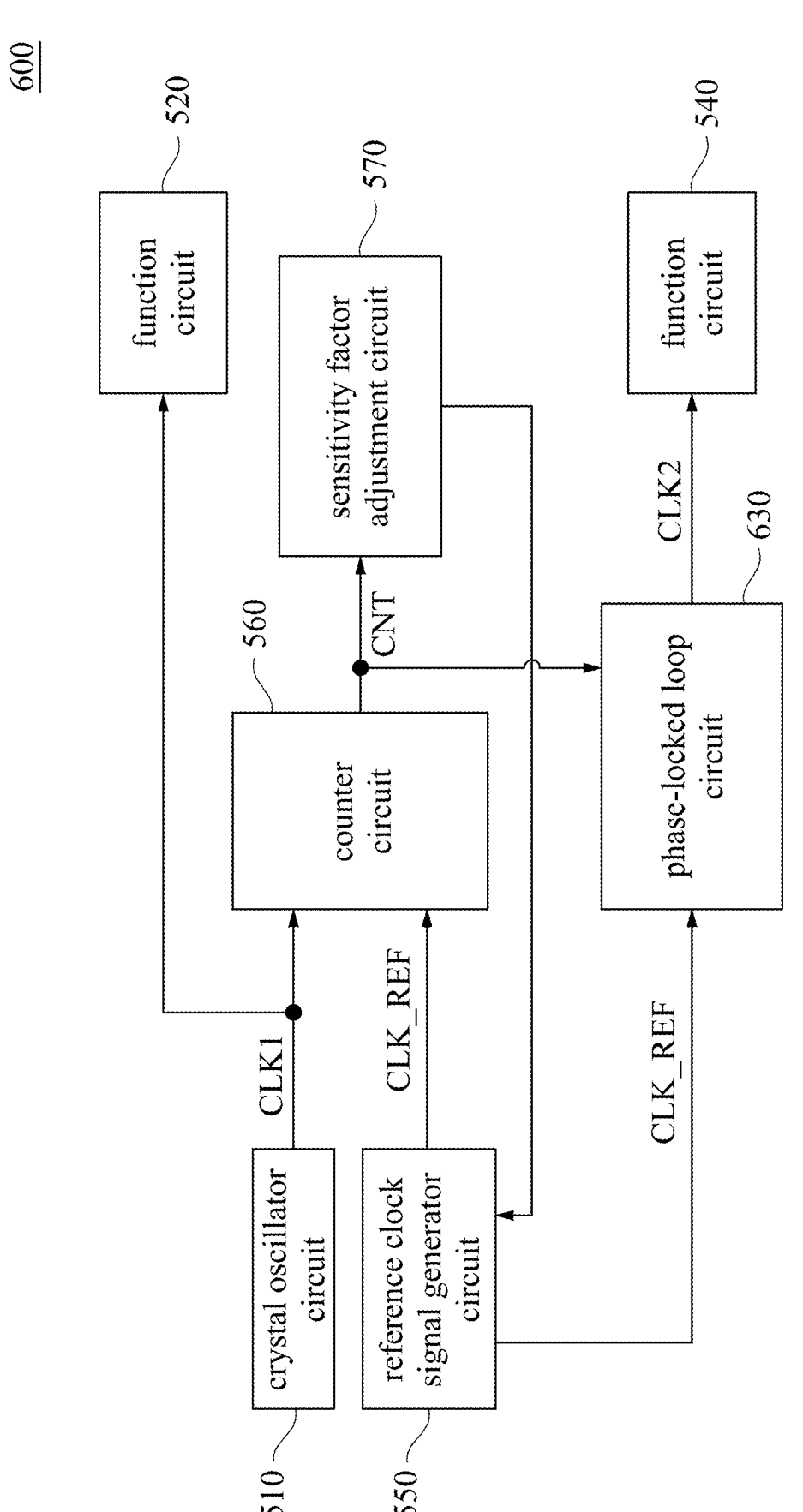
FIG. 6 is a schematic diagram of an integrated circuit with multiple clock signals according to some embodiments of the present disclosure.

Reference is made to FIG. 6. FIG. 6 is a schematic diagram of an integrated circuit 600 with multiple clock signals according to some embodiments of the present disclosure.

Similar to the integrated circuit 500 in FIG. 5, the sensitivity factor adjustment circuit 570 in the integrated circuit 600 can control the reference clock signal generator circuit 550 according to the counting value CNT to adjust the frequency of the reference clock signal CLK_REF. In addition, similar to the integrated circuit 200 in FIG. 2, a phase-locked loop circuit 630 in the integrated circuit 600 can be controlled according to the counting value CNT to adjust the frequency of the clock signal CLK2.

Compared to the integrated circuit 500 in FIG. 5 or the integrated circuit 200 in FIG. 2, the integrated circuit 600 can be adjusted more finely and accurately.

Figure 7:
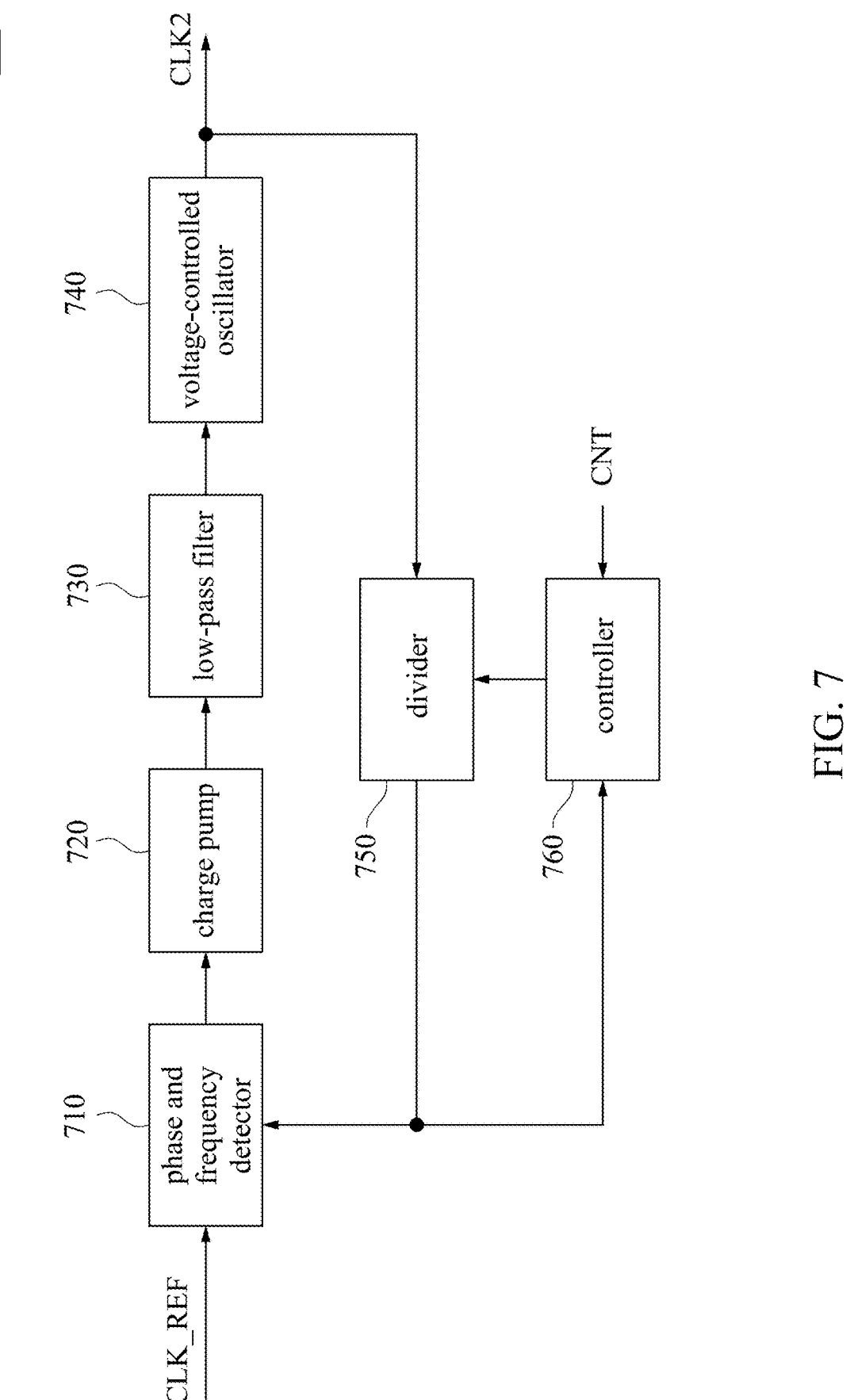
FIG. 7 is a schematic diagram of a phase-locked loop circuit according to some embodiments of the present disclosure.

Reference is made to FIG. 7. FIG. 7 is a schematic diagram of a phase-locked loop circuit 700 according to some embodiments of the present disclosure. In some embodiments, the phase-locked loop circuit 700 can be used to implement the phase-locked loop circuit 230 in FIG. 2 or the phase-locked loop circuit 630 in FIG. 6.

As illustrated in FIG. 7, the phase-locked loop circuit 700 includes a phase and frequency detector 710, a charge pump 720, a low-pass filter 730, a voltage-controlled oscillator 740, a divider 750, and a controller 760.

The phase and frequency detector 710 can receive the reference clock signal CLK_REF and is coupled to the charge pump 720. The charge pump 720 is coupled to the low-pass filter 730. The low-pass filter 730 is coupled to the voltage-controlled oscillator 740. The voltage-controlled oscillator 740 can output the clock signal CLK2 and is coupled to the divider 750. The divider 750 is coupled to the phase and frequency detector 710 and the controller 760. The controller 760 is coupled to the divider 750.

As described above, the phase-locked loop circuit 230 in FIG. 2 or the phase-locked loop circuit 630 in FIG. 6 can be controlled according to the counting value CNT. As illustrated in FIG. 7, the controller 760 in the phase-locked loop circuit 700 can control the divider 750 according to the counting value CNT to control the phase and frequency detector 710 so as to adjust the frequency of the clock signal CLK2.

Figure 8:
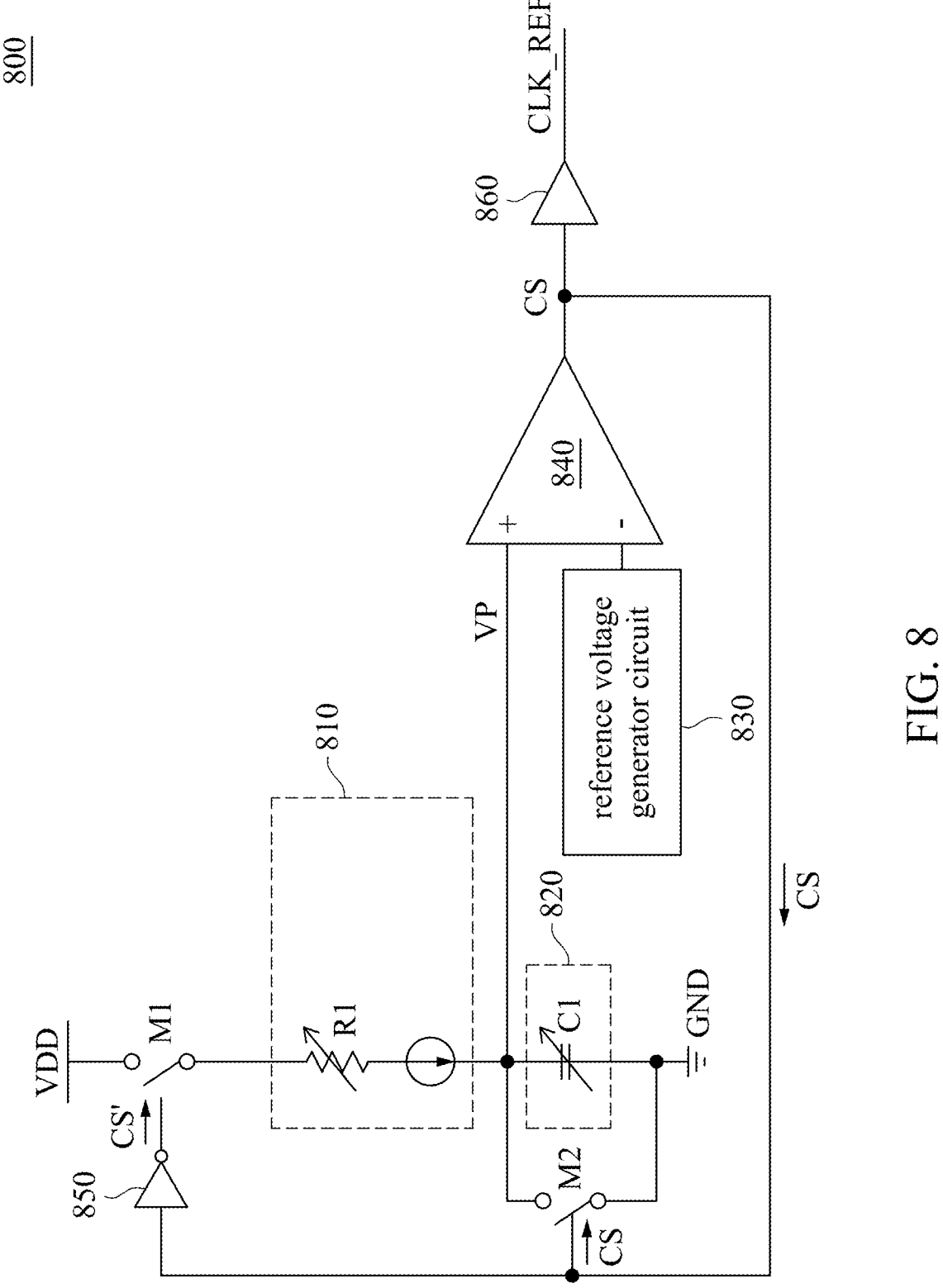
FIG. 8 is a schematic diagram of a reference clock signal generator circuit according to some embodiments of the present disclosure.

Reference is made to FIG. 8. FIG. 8 is a schematic diagram of a reference clock signal generator circuit 800 according to some embodiments of the present disclosure. In some embodiments, the reference clock signal generator circuit 800 can be used to implement the reference clock signal generator circuit 550 in FIG. 5 or FIG. 6. It should be understood that the reference clock signal generator circuit 800 is just one of methods to implement the reference clock signal generator circuit 550. The present disclosure is not limited to using the reference clock signal generator circuit 800 to implement the reference clock signal generator circuit 550.

As illustrated in FIG. 8, the reference clock signal generator circuit 800 includes a charge switch M1, a discharge switch M2, an adjustment circuit 810, an adjustment circuit 820, a reference voltage generator circuit 830, a comparator 840, an inverter 850, and a buffer 860.

In some embodiments, the adjustment circuit 810 can include a variable resistor R1 and the adjustment circuit 820 can include a variable capacitor C1, but the present disclosure is not limited thereto.

In operation, the charge switch M1 is turned on first, so a power voltage VDD can charge a positive input terminal of the comparator 840 through the charge switch M1 and the adjustment circuit 810 to increase a charge voltage VP. When the charge voltage VP is higher than a reference voltage (at a negative input terminal of the comparator 840) generated by the reference voltage generator circuit 830, the comparator 840 outputs a control signal CS with a high logic level. The inverter 850 can generate an inverted control signal CS' with a low logic level according to the control signal CS with the high logic level. The inverted control signal CS' with the low (high) logic level can turn off (turn on) the charge switch M1, and the control signal CS with the high (low) logic level can turn on (turn off) the discharge switch M2. Accordingly, the charge voltage VP discharges to a ground terminal GND through the discharge switch M2 to reduce the charge voltage VP. When the charge voltage VP is lower than the reference voltage (at the negative input terminal of the comparator 840) generated by the reference voltage generator circuit 830, the comparator 840 outputs the control signal CS with a low logic level. By repeating the operations above, the buffer 860 can generate the reference clock signal CLK_REF according to the control signal CS.

As described above, the sensitivity factor adjustment circuit 570 in FIG. 5 or FIG. 6 can control an effective resistance value of the adjustment circuit 810 in the reference clock signal generator circuit 800 to adjust a charge current or control an effective capacitance value of the adjustment circuit 820 in the reference clock signal generator circuit 800 to adjust a quantity of parallel capacitors according to the counting value CNT so as to adjust the frequency of the reference clock signal CLK_REF.

Reference is made to FIG. 9. FIG. 9 is a flow diagram of an operation method 900 according to some embodiments of the present disclosure. As illustrated in FIG. 9, the operation method 900 includes operation S910, operation S920, operation S930, and operation S940.

In some embodiments, the operation method 900 is applied to the integrated circuit 100 in FIG. 1, but the present disclosure is not limited thereto. However, for better understanding, the operation method 900 is described in following paragraphs with reference to the integrated circuit 100 in FIG. 1.

In operation S910, the crystal oscillator circuit 110 generates the clock signal CLK1. In operation S920, the function circuit 120 receives the clock signal CLK1 and operates according to the clock signal CLK1. In operation S930, the phase-locked loop circuit 130 generates the clock signal CLK2 according to the clock signal CLK1. In operation S940, the function circuit 140 receives the clock signal CLK2 and operates according to the clock signal CLK2.

Details of these operations above are described in previous embodiments, so they are not described herein again.

As described above, the present disclosure has advantages of low cost and occupying less space.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An integrated circuit with multiple clock signals, comprising:
   a crystal oscillator circuit configured to generate a first clock signal;
   a first function circuit configured to receive the first clock signal and operate according to the first clock signal;
   a phase-locked loop circuit configured to generate a second clock signal according to the first clock signal;
   a second function circuit configured to receive the second clock signal and operate according to the second clock signal;
   a reference clock signal generator circuit configured to generate a reference clock signal; and
   a counter circuit configured to generate a counting value according to the first clock signal and the reference clock signal,
   wherein the phase-locked loop circuit is configured to generate the second clock signal according to the reference clock signal and the counting value.

2. The integrated circuit with the multiple clock signals of claim 1, wherein the first clock signal has a period, and the counter circuit is configured to count a quantity of a rising edge of the reference clock signal in the period, a quantity of a falling edge of the reference clock signal in the period, a first occurrence quantity of a first logic level of the reference clock signal in the period, or a second occurrence quantity of a second logic level of the reference clock signal in the period to generate the counting value.

3. The integrated circuit with the multiple clock signals of claim 2, wherein when the counting value is different from a threshold value, the phase-locked loop circuit is controlled to adjust a frequency of the second clock signal.

4. The integrated circuit with the multiple clock signals of claim 3, wherein when the counting value is greater than the threshold value, the phase-locked loop circuit is controlled to reduce the frequency of the second clock signal, wherein when the counting value is less than the threshold value, the phase-locked loop circuit is controlled to increase the frequency of the second clock signal.

5. The integrated circuit with the multiple clock signals of claim 2, further comprising:
   a sensitivity factor adjustment circuit configured to control the reference clock signal generator circuit according to the counting value to adjust the reference clock signal.

6. The integrated circuit with the multiple clock signals of claim 5, wherein when the counting value is different from a threshold value, the sensitivity factor adjustment circuit controls the reference clock signal generator circuit to adjust a frequency of the reference clock signal.

7. The integrated circuit with the multiple clock signals of claim 6, wherein when the counting value is greater than the threshold value, the sensitivity factor adjustment circuit controls the reference clock signal generator circuit to reduce the frequency of the reference clock signal, wherein when the counting value is less than the threshold value, the sensitivity factor adjustment circuit controls the reference clock signal generator circuit to increase the frequency of the reference clock signal.

8. The integrated circuit with the multiple clock signals of claim 1, wherein the first function circuit comprises a real time clock circuit.

9. The integrated circuit with the multiple clock signals of claim 1, wherein the second function circuit comprises a central processor circuit, a universal serial bus circuit, or an Ethernet circuit.

10. An operation method of an integrated circuit with multiple clock signals, wherein the operation method comprises:
   generating, by a crystal oscillator circuit, a first clock signal;
   receiving, by a first function circuit, the first clock signal, and operating, by the first function circuit, according to the first clock signal;
   generating, by a phase-locked loop circuit, a second clock signal according to the first clock signal, comprising:
      generating, by a reference clock signal generator circuit, a reference clock signal;
      generating, by a counter circuit, a counting value according to the first clock signal and the reference clock signal; and
      generating, by the phase-locked loop circuit, the second clock signal according to the reference clock signal and the counting value; and
   receiving, by a second function circuit, the second clock signal, and operating, by the second function circuit, according to the second clock signal.

11. The operation method of claim 10, further comprising:
   controlling, by a sensitivity factor adjustment circuit, the reference clock signal generator circuit according to the counting value to adjust the reference clock signal.

12. The operation method of claim 10, wherein generating, by the counter circuit, the counting value according to the first clock signal and the reference clock signal comprises:

counting, by the counter circuit, a quantity of a rising edge of the reference clock signal in a period of the first clock signal, a quantity of a falling edge of the reference clock signal in the period, a first occurrence quantity of a first logic level of the reference clock signal in the period, or a second occurrence quantity of a second logic level of the reference clock signal in the period to generate the counting value.

13. An integrated circuit with multiple clock signals, comprising:

a crystal oscillator circuit configured to generate a first clock signal;

a first function circuit configured to receive the first clock signal and operate according to the first clock signal;

a phase-locked loop circuit configured to generate a second clock signal according to the first clock signal;

a second function circuit configured to receive the second clock signal and operate according to the second clock signal;

a reference clock signal generator circuit configured to generate a reference clock signal;

a counter circuit configured to generate a counting value according to the first clock signal and the reference clock signal; and a sensitivity factor adjustment circuit configured to control the reference clock signal generator circuit according to the counting value to adjust the reference clock signal to generate an adjusted reference clock signal, wherein the phase-locked loop circuit is configured to generate the second clock signal according to the adjusted reference clock signal.

14. The integrated circuit with the multiple clock signals of claim 13, wherein the first clock signal has a period, and the counter circuit is configured to count a quantity of a rising edge of the reference clock signal in the period, a quantity of a falling edge of the reference clock signal in the period, a first occurrence quantity of a first logic level of the reference clock signal in the period, or a second occurrence quantity of a second logic level of the reference clock signal in the period to generate the counting value.

15. The integrated circuit with the multiple clock signals of claim 14, wherein when the counting value is different from a threshold value, the sensitivity factor adjustment circuit adjusts the reference clock signal generator circuit to adjust a frequency of the reference clock signal.

16. The integrated circuit with the multiple clock signals of claim 15, wherein when the counting value is greater than the threshold value, the sensitivity factor adjustment circuit controls the reference clock signal generator circuit to reduce the frequency of the reference clock signal, wherein when the counting value is less than the threshold value, the sensitivity factor adjustment circuit controls the reference clock signal generator circuit to increase the frequency of the reference clock signal.

* * * * *